United States Patent
Han

(10) Patent No.: US 6,933,554 B1
(45) Date of Patent: Aug. 23, 2005

(54) RECESSED TUNNEL OXIDE PROFILE FOR IMPROVED RELIABILITY IN NAND DEVICES

(75) Inventor: K. Michael Han, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 399 days.

(21) Appl. No.: 09/904,042

(22) Filed: Jul. 11, 2001

Related U.S. Application Data

(60) Provisional application No. 60/217,641, filed on Jul. 11, 2000.

(51) Int. Cl.[7] .............................................. H01L 29/72
(52) U.S. Cl. ....................... 257/314; 257/333; 257/353
(58) Field of Search ................................. 257/333, 314, 257/383, 353

(56) References Cited

U.S. PATENT DOCUMENTS

| | | | |
|---|---|---|---|
| 4,590,506 A | | 5/1986 | Esser ........................... 357/24 |
| 5,314,834 A | * | 5/1994 | Mazure et al. ............... 438/301 |
| 5,602,410 A | | 2/1997 | Schwalke et al. ............ 257/401 |
| 5,828,099 A | * | 10/1998 | Van Dort et al. ............ 257/314 |
| 6,097,062 A | * | 8/2000 | Gardner et al. .............. 257/333 |
| 6,429,072 B1 | * | 8/2002 | Tsukiji ......................... 257/321 |
| 6,432,762 B1 | * | 8/2002 | Dalla Libera et al. ....... 257/314 |

FOREIGN PATENT DOCUMENTS

JP HEI 5-55560 3/1993 ................... 29/784

* cited by examiner

*Primary Examiner*—Edward Wojciechowicz
(74) *Attorney, Agent, or Firm*—Farjami & Farjami LLP

(57) ABSTRACT

An improved NAND-type memory cell structure having improved reliability and endurance. Since a high risk area for oxide breakdown and/or current leakage exists in the tunnel oxide layer, source/drain overlap region, the present invention provides a NAND-type memory cell fabricated using controlled formation of the tunnel oxide layer.

10 Claims, 4 Drawing Sheets

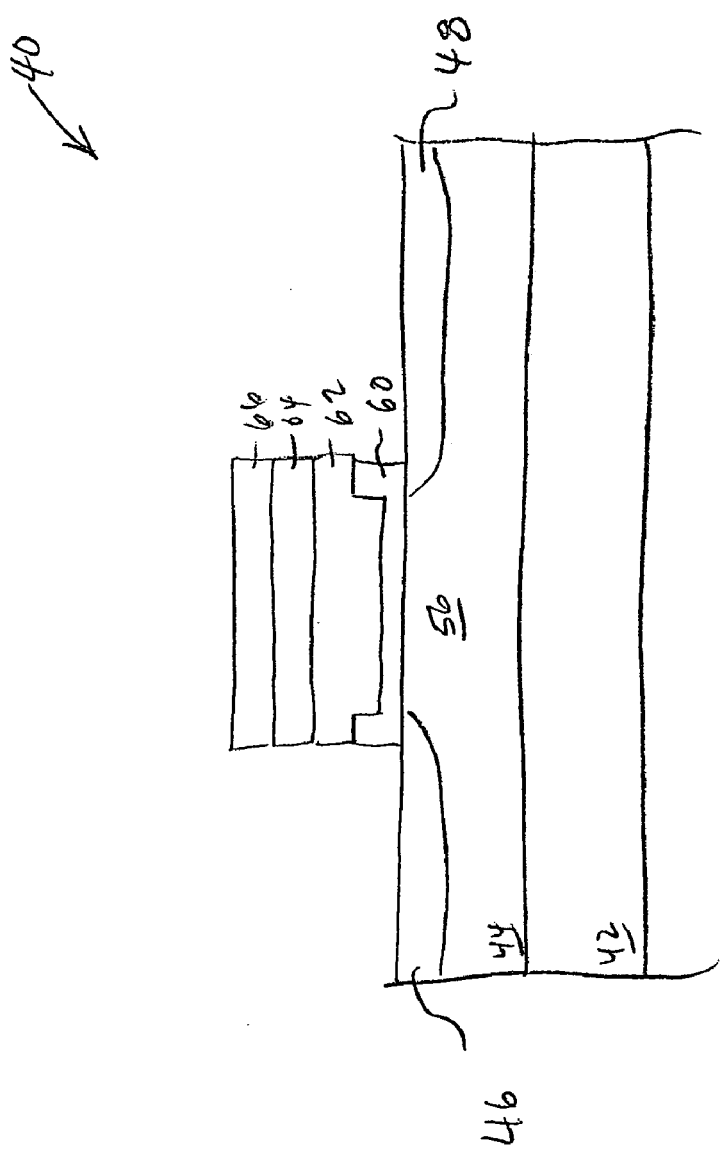
FIG_3

RECESSED TUNNEL OXIDE PROFILE FOR IMPROVED RELIABILITY IN NAND DEVICES

This application claims the benefit and priority of U.S. provisional patent application Ser. No. 60/217,641, filed Jul. 11, 2000 which is herein incorporated by reference for all purposes.

BACKGROUND

1. Field of the Invention

The present invention relates to electrically erasable and programmable read-only memory (EEPROM) technology. More particularly, to a NAND memory device having improved reliability.

2. Description of the Related Art

A conventional NAND array memory device is described with reference to FIG. 1, which is a simplified cross sectional diagram of the conventional NAND array having a floating gate memory cell 10. Memory cell 10 is a floating gate transistor having a control gate 14 separated from a polycrystalline silicon floating gate 16 by an upper insulating layer 18, typically an ONO stack. Floating gate 16 is separated from a substrate 20 by a lower insulating layer or tunnel oxide layer 22, typically of $SiO_2$. The substrate includes n+ source/drain regions 24, a p-doped body region 26, and an n+ drain region 28 as in a conventional NMOS enhancement mode transistor.

To program the conventional floating gate memory cell 10, control gate 14 is biased at a relatively high voltage of approximately 20 volts while body region 26 is grounded. The high voltage on the control gate 14 induces electrons from body region 26 to tunnel through tunnel oxide layer 22 and into floating gate 16 through a conventionally known process called Fowler-Nordheim (F-N) tunneling. The floating gate 16 accumulates negative charge thereby increasing the threshold voltage of memory cell 10. Erasing occurs by biasing body region 26 at a high voltage of approximately 20 volts while the control gate 14 is grounded causing the electrons from floating gate 16 to tunnel through tunnel oxide layer 22 and into the body region 26.

In a NAND-type memory device it is generally desirable to use a thin tunnel oxide region so as to maintain a reasonably high injection field ($E_{inj}$) value. The high injection value should be of the order of that needed across the oxide during programming and erasing. F-N tunneling typically requires injection fields on the order of about 10 Mv/cm to narrow the silicon-oxide energy barrier so that electrons can tunnel from the silicon into the oxide. The $E_{inj}$ value of the silicon-oxide interface can be calculated as shown in Equation 1, where $V_{app}$ represents the voltage on the floating gate, $V_{fb}$ represents the flatband voltage, and $T_o$, represent the oxide thickness:

$$E_{inj}=(V_{app}-V_{fb})/T_{ox} \qquad \text{Eq. 1}$$

Equation 1 shows that for a given voltage applied on the floating gate and a given flatband voltage, the injection field is inversely proportional to the thickness of the oxide. Therefore, thin oxides must be used in devices which are to be used to achieve large injection fields at moderate voltages.

The continuous charging and discharging of the floating gate occurs in the active region of the substrate which includes channel region 30 and overlap regions 32. Most of the electric flow occurs in the channel region 30 because of the large area it occupies and to a lesser extent in overlap regions 32 which occupies a smaller area. Unfortunately, it has been shown that the continuous cycling of electrons through tunnel oxide layer 22 through overlap region 32 may degrade the quality of the tunnel oxide in that region and eventually lead to breakdown and/or current leakage, which reduces the endurance and data retention capability of cell 10.

In channel region 30, $$E_{inj}=(V_{app}-V_{fb}-2\phi_F)/T_{ox} \qquad \text{Eq. 2}$$

where $2\phi_F=(kT/q)\log(N_{AA}/n_i)$. The term $2\phi_F$ is the amount of surface band bending at the $SiO_2/Si$ interface due to carrier inversion. $N_{AA}$ is the channel doping concentration and $n_i$ is the intrinsic carrier concentration. Typically, $V_{fb}\cong-1.0$ volt.

In overlap region 32, $$E_{inj}'=(V_{app}-V_{fb}')/T_{ox} \qquad \text{Eq. 3}$$

where $V_{fb}'=0$ volts for n+ poly gate and n+ source/drain region.

Therefore, in general $$E_{inj}'>E_{inj}$$

For these reasons, what is desired is an NAND array, which has improved reliability. Particularly, what is needed is a NAND array that has an improved silicon-tunnel oxide interface that reduces the potential for breakdown or current leakage in the overlap region while maintaining a relatively high injection field for programming and erasing functions.

SUMMARY

The present invention provides an improved NAND-type memory cell structure having improved reliability and endurance. As described above, a high risk area for oxide breakdown or current leakage exists in the oxide layer, source/drain overlap region. To reduce the risk, the present invention provides a NAND-type memory cell fabricated using controlled formation of the tunnel oxide layer.

Advantageously, the tunnel oxide layer is formed over the active region of the substrate, such that the thickness of the tunnel oxide in the overlap region is greater than the thickness of the tunnel oxide in the channel region. Preferably, as indicated above with reference to Equation 1, for a given voltage an increase in the thickness of the tunnel oxide layer portion in the overlap region will cause the injection field at the overlap region to be reduced. By reducing the injection field in the overlap region, the potential for oxide breakdown and/or current leakage in the overlap region is reduced as well. The tunnel oxide layer portion overlaying the channel region of the active region is thinner than the oxide layer in the overlap region, thus ensuring that a suitable injection field is attained for programming and erasing functions.

In one aspect of the invention a memory cell is provided. The memory cell includes a semiconductor substrate which has a first region and a second region of one conduction type, and a channel region therebetween of an opposite conduction type. The memory cell also includes a gate insulating layer, which may be formed over the substrate. The gate insulating layer may have a first thickness formed over the first region and the second region, and a second thickness formed over the channel region.

In another aspect a method for fabricating a memory cell is provided, which includes providing a semiconductor substrate which has a first region and a second region of one conduction type and a channel region therebetween of an opposite conduction type. The method also includes forming a first portion of a gate insulating layer over the first region and the second region; and forming a second portion of the gate insulating layer over the channel region. The first portion will be formed with a first thickness, while the second portion will be formed to have a second thickness.

The present invention may be better understood, and its numerous objects, features, and advantages made apparent to those skilled in the art by referencing the accompanying drawings.

BRIEF DESCRIPTION OF THE DRAWINGS

FIG. 3 is a simplified illustration of a cross-sectional view of an improved NAND-type memory cell according to the principles of the present invention.

DETAILED DESCRIPTION

Figure 2A:
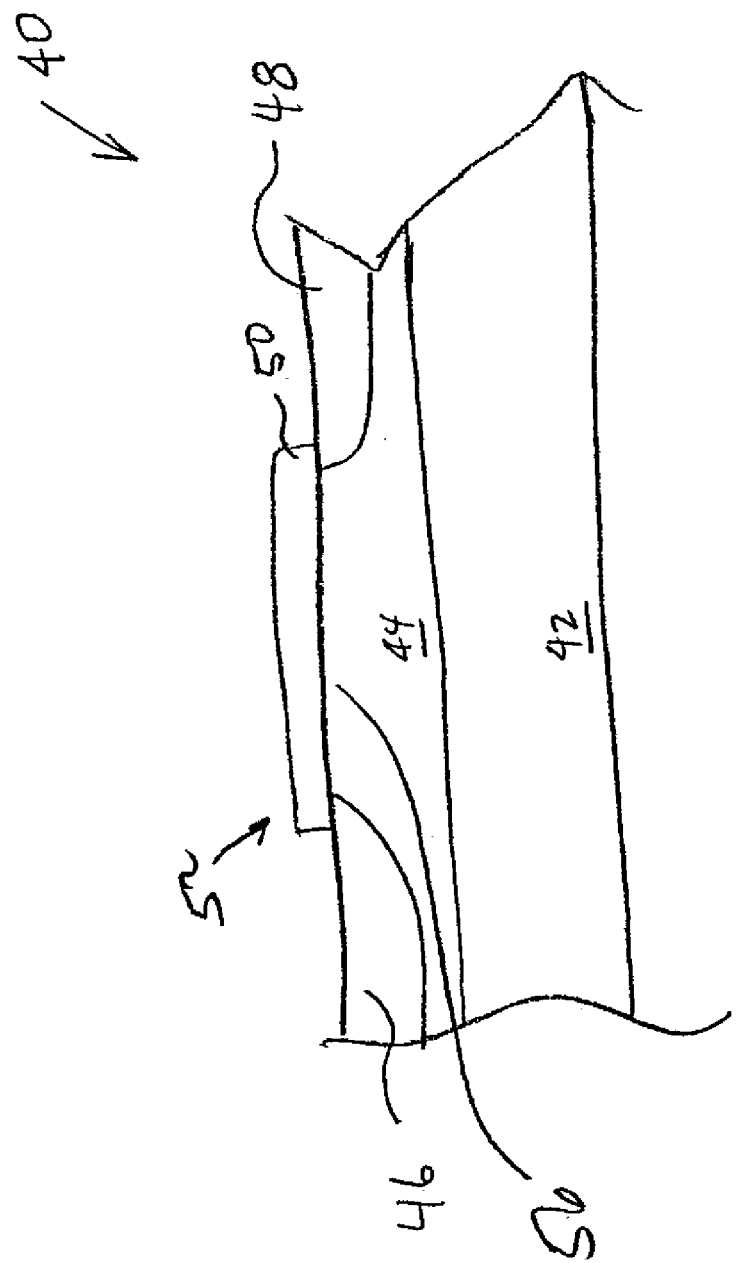
FIGS. 2A–2B. are simplified illustrations of cross-sectional views of portions of an improved memory device in various stages of fabrication according to principles of the present invention.

Referring now to FIG. 2A, in one embodiment of the present invention, a portion of a NAND-type memory cell 40 is formed of an active region having a deep N-well 42 and a P-well 44. The P-well region 42 has a source region 46 and a drain region 48.

In this embodiment, a tunnel oxide layer 50 is formed or grown over the active region of memory cell 40. Tunnel oxide layer 50 is preferably an $SiO_2$ layer, grown by passing oxygen over an Si substrate in a furnace at a temperature of approximately 1200° C. In a preferred embodiment of the invention, illustrated in FIG. 2B, tunnel oxide layer 50 is formed in a two step process. First, a first portion 52 of tunnel oxide layer 50 is formed over the substrate active region as described above. First portion 52 may have a thickness T that is equal to a thickness necessary for ensuring that the injection field is such that the risk of cell failure in the overlap regions 58 is reduced. The thickness T of first portion 52 may range from between about 15 nm to about 30 nm, preferably between about 18 nm and 25 nm, for example 20 nm. By using a tunnel oxide thickness in these ranges, the field injection in the overlap region may be made equal to between about 4 MV/cm and 6 MV/cm, preferably 5 MV/cm. These injection field ranges lead to a current density in the overlap region of between about $5.3×10^{-9}$ $A/cm^2$ and $5.1×10^{-10}$ $A/cm^2$, preferably $1.25×10^{-13}$ $A/cm^2$. By reducing the injection field and current density, the risk of oxide breakdown and/or current leakage is reduced.

Figure 2B:
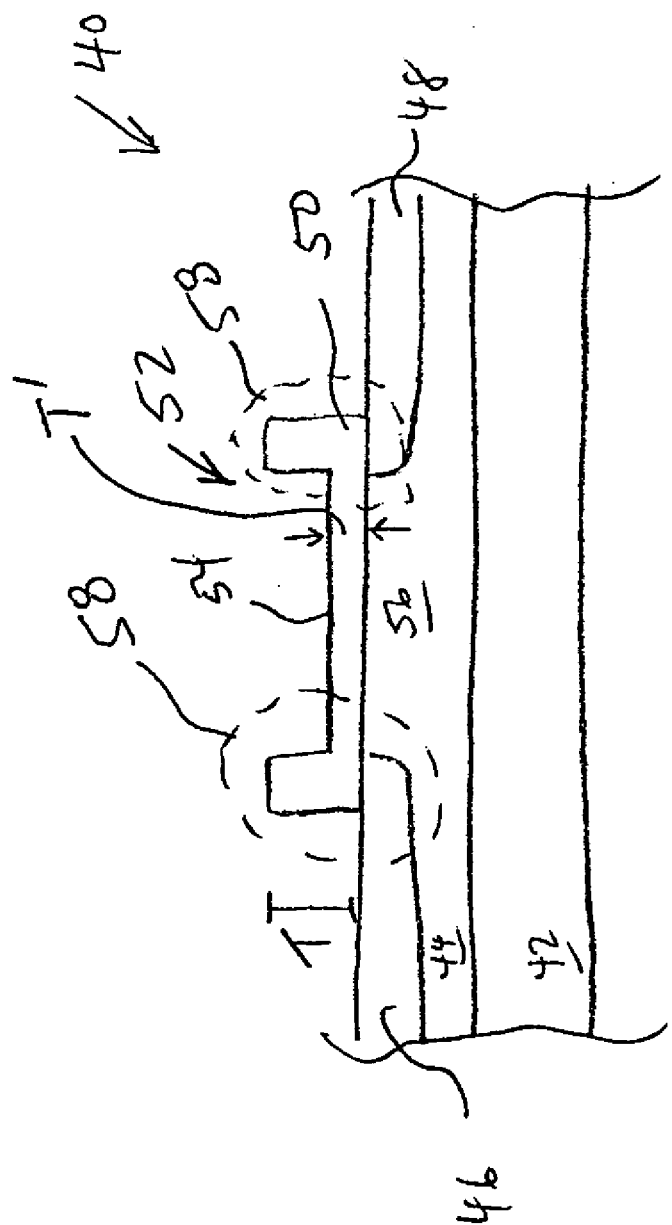

Next, as shown in FIG. 2B, a second portion 54 of tunnel oxide layer 50 is formed directly into first portion 52. The second portion is a recessed portion 54, formed into a section of layer 50 that is directly over channel region 56—the predominate area of electron flow during programming and erase functions of the cell. Recessed portion 54 is cut into, removed from, or otherwise formed into tunnel oxide layer 50 using a typical oxide layer removal means. For example, in one embodiment, a portion 54 of tunnel oxide layer 50 may be removed, except for regions that overlap with source region 46 and drain region 48 by use of a conventional anisotropic dry etch technique. A suitable dry etch technique directs a mixture of $Cl_2$ and HBr gases with flow rates of about 30 sccm and 70 sccm, respectively, at tunnel oxide layer 50 until a predetermined depth is obtained.

As best illustrated in FIG. 2B, the remaining portion of the tunnel oxide layer 50 in recessed portion 54 is thinner than the oxide layer in the overlap region. The thin oxide layer may have a thickness T' over channel region 56, which may range from between about 4 nm to about 12 nm, preferably between about 8 nm and 10 nm, for example 9 nm. By using a tunnel oxide thickness in these ranges, the field injection in channel region 56 may be made equal to between about 8 MV/cm and 11 MV/cm, preferably 10 MV/cm. These injection field ranges lead to a current density in active region 56 of between about between about $1.878×10^{-5}$ $A/cm^2$ and $0.121$ $A/cm^2$, preferably $0.0114$ $A/cm^2$.

In a specific embodiment, described here by way of example with no intention to limit the invention thereby, memory cell 40 as shown in FIGS. 2A and 2B, has tunnel oxide layer 50 formed over active region 56. Layer 50 also overlaps a portion of source region 46 and drain region 48 indicated as overlap regions 58. In this example, tunnel oxide layer 50 is formed with a preferred thickness of about 20 nm. When a voltage of 10 V is applied across the 20 nm of thick tunnel oxide in overlap regions 58, an injection field of approximately 5 MV/cm is attained. Following the formation of layer 50, a portion of layer 50 is etched out to form a recess in the portion of the layer formed over channel region 56. In this example, recessed portion 54 has a thickness T' of about 10 nm. When a voltage of 10 V is applied across the 10 nm thick recessed oxide layer 54, an injection field of 10 MV/cm is attained. Thus, as illustrated, $E_{inj}$ in overlap region 58 is half that of $E_{inj}$ the channel region. Hence, less degradation in the tunnel oxide in the overlap region 58 is expected. Therefore, retention and endurance of the memory cell is improved, for example, by an order of magnitude.

Figure 1:
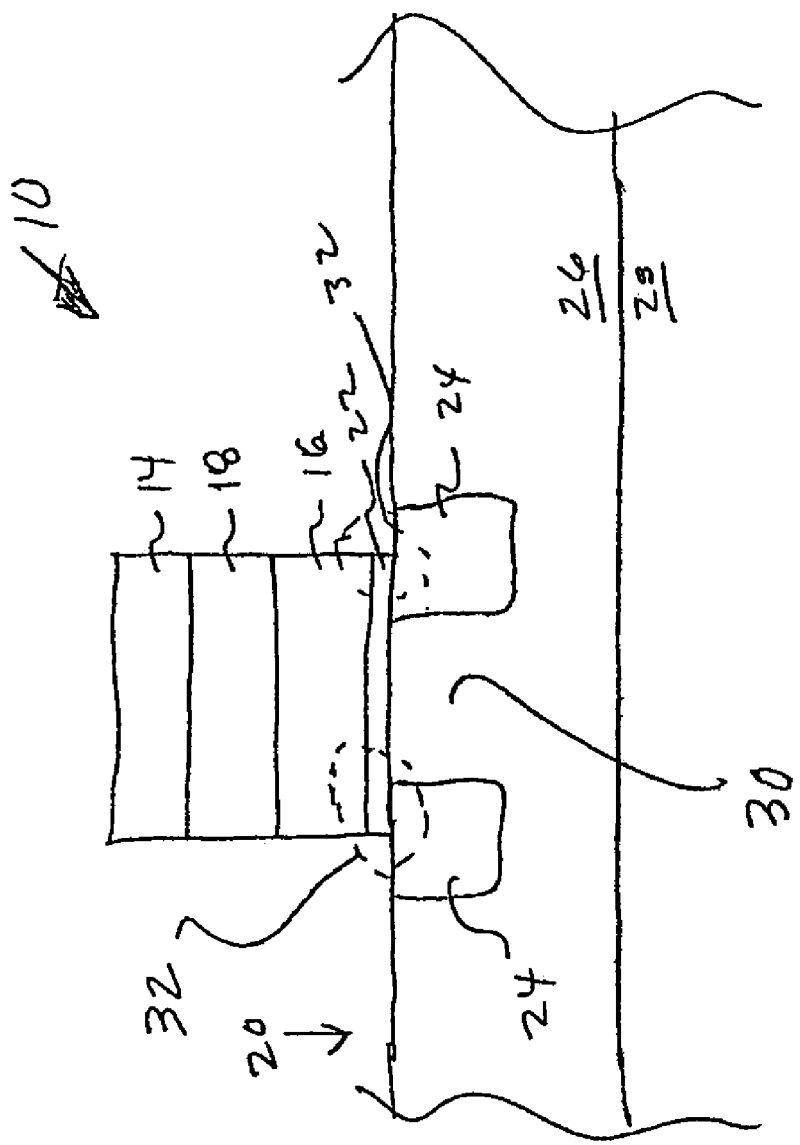
FIG. 1 is a simplified cross-sectional diagram of a conventional floating gate memory cell of a NAND array.

Referring now to FIG. 3, the remainder of the memory cell as shown, may be fabricated in the conventional manner described below. A layer of amorphous silicon 62 is deposited over the recessed tunnel oxide layer 60 using a chemical vapor deposition (CVD) process. The CVD process involves directing a mixture of silane gas ($SiH_4$) and a phosphene ($PH_3$) and helium gas mixture towards tunnel oxide layer 60 in an environment with a temperature between 510 and 550° C., preferably 530° C. The flow rate of the silane gas is between about 1500 sccm and 2500 sccm, preferably 2000 sccm. The flow rate of the phosphene-helium gas mixture is between about 15 sccm and 30 sccm, preferably 22 sccm. In the phosphene and helium gas mixture, phosphene is provided at approximately one percent of the mixture. In this embodiment, the desired doping level in the amorphous silicon is between about $1×10^{19}$ $atoms/cm^3$ and $5×10^{19}$ $atoms/cm^3$, preferably $2×10^{19}$ $atoms/cm^3$. Alternatively, a layer of amorphous silicon 62 may be deposited over tunnel oxide layer 60 using a low pressure chemical vapor deposition (LPCVD) process. In either alternative, the resulting amorphous silicon layer 62 corresponds to floating gate 16 of FIG. 1 when it is subsequently annealed.

A first oxide layer is deposited over floating gate 62 using a Low Pressure Chemical Vapor Deposition (LPCVD) process. In the LPCVD process, silane and $N_2O$ gases are directed towards the surface of the semiconductor substrate at flow rates of about 20 sccm and 1200 sccm, respectively. The resulting structure is then heated to a temperature of 750° C. in an environment with a pressure of 600 millitorr (hereinafter "first oxide heating step"). In this embodiment, the thickness of first oxide layer 44 is 50 Å.

Next, a middle nitride layer is deposited using an LPCVD process. First, a mixture of dichloro-silane gas (SiH$_2$Cl$_2$) and ammonia gas (NH$_3$) are directed towards the structure with flow rates of about 100 sccm and 600 sccm, respectively. The resulting structure is then heated to a temperature of 760° C. In this embodiment, middle nitride layer 48 is formed to a thickness of approximately 80 Å.

An upper oxide layer is then formed on the resulting structure using a wet thermal oxidation process. First, O$_2$ and H$_2$ are directed to the structure at flow rates of 5 L/min and 9 L/min, respectively. The resulting structure is then heated to 950° C. In this embodiment, approximately 20 to 25 Å of the middle nitride layer are oxidized to form a 40 to 50 Å thick upper oxide layer 52. In this embodiment, the first oxide layer, the middle nitride layer, and the upper oxide layer together form an ONO stack 64 as shown in FIG. 3, which is approximately 130 Å.

After formation of ONO stack 64, a second layer of amorphous silicon 66 is deposited over ONO stack 64 using an LPCVD process. The LPCVD process involves directing a mixture of silane gas and a phosphene-helium gas-compound towards structure 64 with flow rates of about 2000 sccm and 75 sccm, respectively, in an environment with a temperature of about 530° C. In the phosphene-helium gas-compound, phosphene represents one percent of the mixture. In this embodiment, the desired doping level of the second layer of amorphous silicon 62 is about 2×10$^{20}$ atoms/cm$^3$. The second layer of amorphous silicon corresponds to an intermediate form of a second layer of polysilicon (poly II layer) 66. In this embodiment, the thickness of the poly II layer is about 1200 Å.

Next, tungsten silicide (WSi$_x$) layer is deposited conventionally over the device by a mixture of WF$_6$ and silane using an LPCVD process. The value of x varies from 2.1 to 2.6. In this embodiment, the thickness of the tungsten silicide layer 66 is about 1500 Å.

In one embodiment, a silicon oxy-nitride (SiON) layer is deposited conventionally over poly II layer 66 using a mixture of silane and N$_2$O in a CVD process. In this embodiment, the thickness of SiON layer is about 1000 Å.

The processing steps remaining to complete the NAND-type memory may include: etching SiON layer, tungsten silicide layer, poly II layer 66, and ONO 64 from above source region 46 and drain region 48; an MDD implant in source region 46 and drain region 48; an MDD anneal; a spacer deposition and etch; a contact mask and etch; and an HTO deposition. The process steps, thus described, are intended to illustrate one embodiment of the fabrication process for a representative NAND-type memory cell. Modifications, additions, and deletions to the above process may be made while maintaining the scope of the present invention.

Although the present invention has been described with reference to specific embodiments, these embodiments are illustrative only and not limiting. Many other applications and embodiments of the present invention will be apparent in light of this disclosure and the following claims.

What is claimed is:

1. A memory cell comprising:
    a semiconductor substrate having a first region and a second region of one conduction type and a third region therebetween of an opposite conduction type;
    a single gate insulating layer situated over an entire length of said third region and substantially less than an entire length of each of said first region and said second region, said single gate insulating layer having a first thickness situated over said first region and said second region, and a second thickness situated over said third region, said first thickness being greater than said second thickness, wherein said first thickness is substantially uniform and said second thickness is substantially uniform; and
    a control gate situated over said single gate insulating layer.

2. A memory cell comprising:
    a semiconductor substrate having a first region and a second region of one conduction type and a third region therebetween of an opposite conduction type;
    a single gate insulating layer situated over an entire length of said third region and substantially less than an entire length of each of said first region and said second region, said single gate insulating layer having a first thickness situated over said first region and said second region, and a second thickness situated over said third region, said first thickness being greater than said second thickness, wherein said first thickness is substantially uniform and said second thickness is substantially uniform; and
    an ONO stack situated over said single gate insulating layer.

3. A memory cell as in claim 1, wherein said first thickness is between about 20 and 30 nm and wherein said second thickness is between about 8 and 11 mm.

4. A memory cell as in claim 1, wherein an injection field in an overlap region situated between said single gate insulating layer and said first and second regions ranges between approximately 4 Mv/cm and approximately 6 Mv/cm.

5. A memory cell as in claim 1, wherein an injection field in an overlap region situated between said single gate insulating layer and said third region ranges between approximately 8 Mv/cm and approximately 11 Mv/cm.

6. A memory cell as in claim 1, wherein said single gate insulating layer comprises SiO$_2$.

7. A memory cell as in claim 2, wherein said first thickness is between about 20 and 30 nm and wherein said second thickness is between about 8 and 11 nm.

8. A memory cell as in claim 2, wherein an injection field in an overlap region situated between said single gate insulating layer and said first and second regions ranges between approximately 4 Mv/cm and approximately 6 Mv/cm.

9. A memory cell as in claim 2, wherein an injection field in an overlap region situated between said single gate insulating layer and said third region ranges between approximately 8 Mv/cm and approximately 11 Mv/cm.

10. A memory cell as in claim 2, wherein said single gate insulating layer comprises SiO$_2$.

* * * * *